(12) United States Patent
Chyan

(10) Patent No.: US 6,750,528 B2
(45) Date of Patent: Jun. 15, 2004

(54) BIPOLAR DEVICE

(75) Inventor: Yih-Feng Chyan, New Providence, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/767,477

(22) Filed: Jan. 23, 2001

(65) Prior Publication Data

US 2002/0096678 A1 Jul. 25, 2002

(51) Int. Cl.⁷ .................. H01L 29/00; H01L 27/102
(52) U.S. Cl. .................. 257/525; 257/566; 257/526
(58) Field of Search ............... 257/59, 506, 525, 257/566; 438/225

(56) References Cited

U.S. PATENT DOCUMENTS

| 5,216,275 A | * | 6/1993 | Chen ..................... 257/493 |
| 5,508,552 A | * | 4/1996 | Iranmanesh et al. ........ 257/571 |
| 5,552,626 A | * | 9/1996 | Morikawa ................... 257/525 |

* cited by examiner

Primary Examiner—Amir Zarabian
Assistant Examiner—Kiesha Rose
(74) Attorney, Agent, or Firm—Ferdinand M. Romano

(57) ABSTRACT

An integrated electronic device includes a semiconductor substrate layer having a major surface formed along a crystal plane. In one embodiment a first conductivity type region is formed in the substrate layer and a substantially monocrystalline semiconductor layer is deposited thereon. The deposited layer includes a first portion of a second conductivity type and a second portion of the first conductivity type formed over the first portion. The first portion and the first region form a pn junction.

An upper-most substrate surface formed along a first plane and a first doped region of a first conductivity type is formed above the first plane. A second doped region of a second conductivity type is formed over the first doped region resulting in formation of a p-n junction in a second plane above the first plane. Electrical connection is provided to the first doped region with a conductor formed between the first and second planes.

17 Claims, 4 Drawing Sheets

BIPOLAR DEVICE

FIELD OF THE INVENTION

The present invention is directed to silicon products incorporating junctions designed to conduct current and methods of making such devices. More specifically the invention relates to bipolar devices providing low-power, high-speed performance.

BACKGROUND OF THE INVENTION

Currently there are over one hundred types of semiconductor devices, many of which are based on the well known p-n junction. Strictly speaking the p-n junction is a bipolar device but, as a building block of much integrated circuit design, these devices are usually one-sided in that one side of the junction is more heavily doped than the other. The semiconductor diode, functionally a descendant of the vacuum tube, may be the most basic application of the junction. The bipolar transistor, essentially two p-n junctions in series, i.e., pnp or npn, has often been regarded as the technology of choice for high performance applications, especially high speed switching. With ever increasing performance demands as communications circuits reach toward and beyond 40 gigabit per second speeds, solutions are needed to reduce collector resistance and collector-to-substrate junction capacitance in bipolar transistors. See, for example, U.S. Pat. No. 4,929,996 which discloses a buried collector layer electrically connected to a vertical collector conductor, with base and emitter regions formed in the collector epitaxial material.

SUMMARY OF THE INVENTION

The present invention is directed to a device architecture and a process for fabricating a semiconductor device incorporating a p-n junction. In preferred embodiments of the invention, an integrated electronic device includes a substrate layer of semiconductor material having a major surface formed along a crystal plane. A first region of a first conductivity type is formed in the substrate layer. A semiconductor layer, formed on the first region, e.g., by epitaxial growth, includes a first portion of a second conductivity type and a second portion of the first conductivity type formed over the first portion. The first portion and the first surface region form a pn junction.

An integrated electronic device is also provided with a substrate layer of semiconductor material having a major surface formed along a crystal plane and a deposited semiconductor layer formed on the substrate layer. The deposited layer includes a first portion of a first conductivity type and a second portion of a second conductivity type formed over the first portion. The first portion is formed along a plane parallel to the major surface. A dielectric layer is positioned over the semiconductor layer with a contact via formed therein to provide an electrical path from the plane along which the first portion is formed to a region above the plane. A conductive layer provides an electrical path in the plane from the first portion to the contact via. In a preferred embodiment the deposited semiconductor layer is substantially monocrystalline and may be epitaxially grown.

In an exemplary construction of the invention the epitaxially grown layer includes a bipolar transistor collector of a first conductivity type and a bipolar transistor base of a second conductivity type formed over the collector and a portion extending from the major surface to the collector. A conductive layer extending between the major surface and the emitter provides electrical connection to the collector.

According to an associated method of fabricating a semiconductor device a substrate layer includes an upper-most surface formed along a first plane and a first doped region of a first conductivity type is formed above the first plane. A second doped region of a second conductivity type is formed over the first doped region resulting in formation of a p-n junction in a second plane above the first plane. An electrical connection is provided to the first doped region with a conductor formed between the first and second planes.

The drawings are not to scale, but rather, provide schematic representations of a circuit structure to emphasize relevant features relating to the invention. Accordingly, numerous incidental details are not illustrated. For example, deposited layers which may in fact be conformal are not necessarily illustrated as such.

Terminology

Collector means that portion of a semiconductor layer that performs the collector function of a bipolar transistor device during transistor action, including conduction of current and collection of charge. A collector does not include an adjoining region of similar conductivity type if the absence of such region will not alter the electrical characteristics of the transistor.

Subcollector means a region of semiconductor material adjoining the collector which may be of the same conductivity type as the collector but which is not needed to perform or influence any collector function

DETAILED DESCRIPTION OF THE INVENTION

An example embodiment of the invention includes an npn transistor the fabrication of which is illustrated in the figures. However, the design features and fabrication sequence is readily adapted to fabrication of pnp devices as well. Therefore, my choice of the npn transistor for the following discussion is for purposes of illustration and is not intended to limit the scope of the invention.

Figure 1:
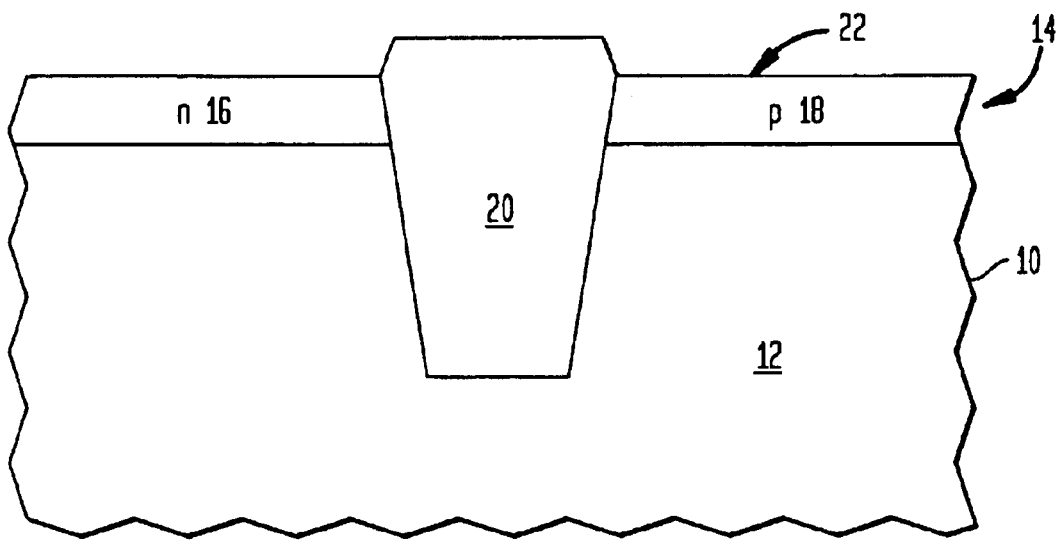
FIGS. 1 through 7 illustrate in partial cross sectional view a circuit structure incorporating the invention during sequential stages of fabrication.

This embodiment of the invention incorporates complementary bipolar transistors formed on an integrated circuit structure. FIG. 1 provides a partial cross sectional view of a semiconductor substrate layer 10 having a lightly doped p-type lower portion 12 and an upper portion 14 comprising n-type semiconductor regions 16 and p-type semiconductor regions 18 isolated from one another by a trench region 20. One region 16 and one region 18 are illustrated in the figure. The substrate and other semiconductor features described herein are, preferably, composed of silicon but other embodiments of the invention may be based on a variety of semiconductor materials (including compound semiconductors) alone or in combination.

For purposes of illustration it is assumed that the upper surface 22 of the substrate portion 14 is formed along the <100>crystal plane of a conventionally formed silicon layer 10. Although the upper portion 14 may be epitaxially grown over the lower portion 12, this is not needed for the preferred embodiments. Rather, the regions 16 and 18 are readily formed by standard mask and implant steps or by solid source diffusion techniques.

Further description of the example embodiment is limited to formation of an npn transistor device over the p type region 18, and it will be readily apparent from such how one may form a pnp device over the n-type region 16 in a complementary bipolar fabrication sequence. The net dopant concentration in the p region over which the npn transistor is to be formed is on the order of $10^{17}$ cm$^{-3}$.

Figure 2:
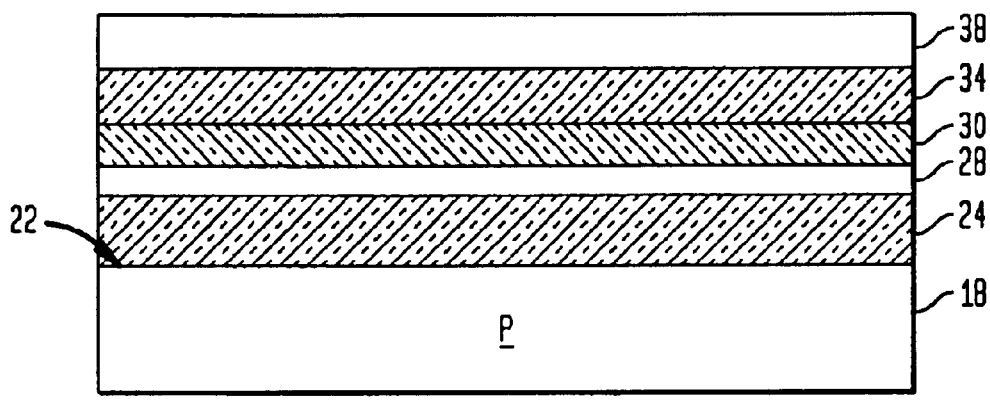

As a matter of design choice, one may choose to construct complementary metaloxide-semiconductor (CMOS) field effect transistors over pairs of regions 16 and 18 in combination with formation of npn transistors, pnp transistors or the complementary bipolar pair (all of the foregoing referred to as BiCMOS technologies). FIG. 2 illustrates a sequence of layers to be formed over the entire upper portion 14 although the layers are only shown over one p-type region 18. Initially a silicon oxide layer 24 approximately 1000A (100 nm) in thickness is formed over the surface 22. Preferably this insulator is deposited by decomposition of a tetraethyl orthosilicate precursor, or TEOS, $Si(OC_2H_5)_4$.

Decomposition of vaporized liquid TEOS to form a silicon oxide film (referred to herein as a TEOS-deposited oxide) typically occurs by chemical vapor deposition (CVD) at 650 C.–750 C. in an oxygen environment. Such TEOS depositions are known to provide good uniformity and step coverage when needed. Generally, the deposited film is understood to be a non-stoichiometric oxide of silicon, although it is often referred to as silicon dioxide. Inclusion of ozone ($O_3$), e.g., up to 10 percent of the reacting oxygen, facilitates lower temperature deposition. A typical reaction which includes ozone is performed at 400 C. and 300 Torr with 4 standard liters per minute (slm) oxygen, the oxygen comprising 6 percent ozone, 1.5 slm He and 300 standard cubic centimeters per minute (sccm) TEOS.

Next a layer 28 of low-sheet resistance conductor is formed over the silicon oxide layer 24. To reduce sheet resistance the layer 28 comprises WSi. Other suitable constituents for the layer 28 include CoSi2, TiSi2 and TiN. To further reduce sheet resistance of the layer 24 the layer may be implanted with phosphorous, e.g., $10^{14}$/cm$^{-2}$ to $10^{15}$ cm$^{-2}$, at an energy on the order of 10 KeV. A second layer 30 of TEOS-deposited silicon oxide is then deposited to a thickness ranging between approximately 1200 A (120 nm) and 1800 A (180 nm), and a layer 34 of polysilicon, 1200 (120 nm) is formed thereon by furnace deposition. Because the layer 34 will serve as an extrinsic base it should be doped p-type to a concentration approximately in the range $10^{18}$ cm$^{-3}$ to $10^{20}$ cm$^{-3}$ to render a low sheet resistance, e.g., less than 10 ohm per square. This may be accomplished in situ as the layer 34 is deposited, or afterward by ion implantation. An insulative layer 38, e.g., 1000 A (100 nm) silicon nitride, is deposited over the polysilicon layer 34 by chemical vapor deposition (CVD), low pressure CVD or plasma enhanced CVD.

Figure 3:
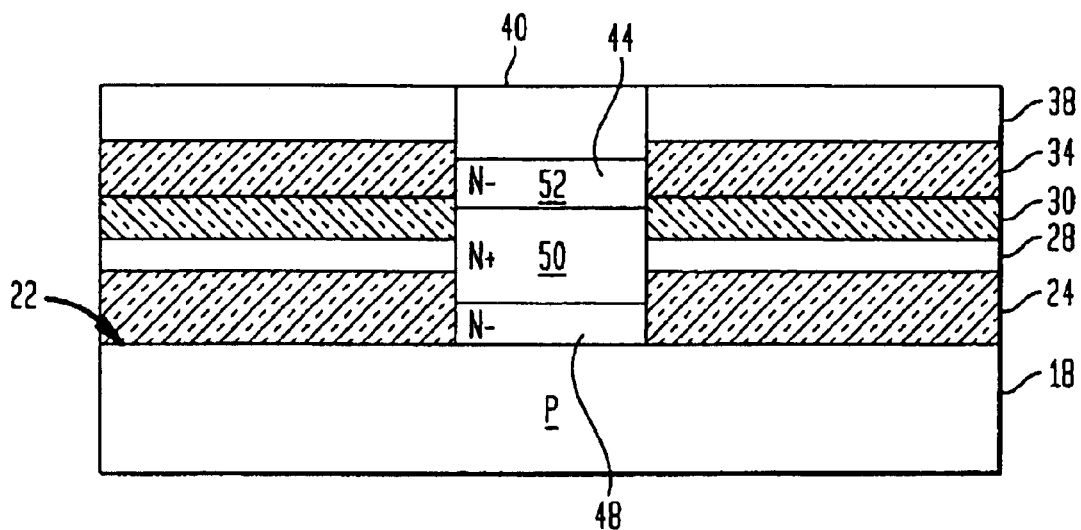

Referring next to FIG. 3 an opening 40 is etched through the layers 38, 34, 30, 28 and 24 to the surface 22 of the p-type region 18. The width (i.e., along the cross sectional view) of the opening 40 is determined by the size constraints of the desired device as well as limitations of the photolithographic techniques employed to define the opening 40. With currently available techniques the width of the opening 40 preferably ranges between 0.2 and 0.5 micron. The length of the opening (i.e., orthogonal to the cross sectional view) is largely a matter of design choice. The larger the overall cross sectional area (i.e., in a plane parallel with the surface 22), the greater the amount of current which will pass through the conductor 28 and a yet-to-be-formed collector-base junction in the opening 40.

The opening 40 is created by conventional lithographic patterning with photoresist followed by a conventional anisotropic etch which removes portions of the multiple insulative layers 38, 34 and 30 with appropriate etch chemistries. An isotropic etch (e.g., 100 parts $H_2O$ to one part HF) is employed to remove the portion of the conductor 28 within the opening as well as the underlying silicon oxide layer 24. See FIG. 3.

With the surface 22 of the region 18 exposed by the etch process, approximately 3000 A (300 nm) of silicon is deposited in the opening 40 to form device quality crystal in the form of a plug 44. The silicon is epitaxially grown over the surface 22 reaching to exposed portions of the polysilicon layer 34. Alternate techniques such as a laser anneal or other melt technique can be employed to render the deposited plug 44 a substantially monocrystalline extension of the region 18 above the surface 22. It is preferred that the crystal lattice be continuous between the region 18 and the plug 44 to assure a high quality p-n junction when such is desired.

Figure 4:
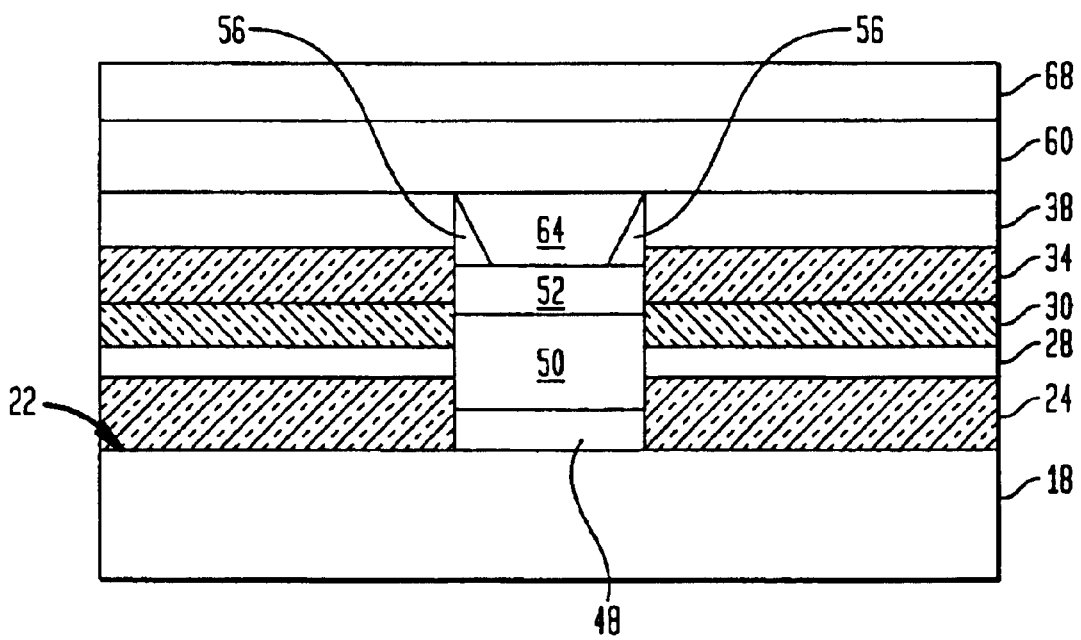

With epitaxial techniques initial growth of the plug 44 over the surface 22 is lightly doped n-type, e.g., $10^{16}$ cm$^{-3}$ forming a subcollector 48 over which the collector 50 is formed with a graded n-type distribution having a peak value on the order of $10^{18}$ cm$^{-3}$ to $10^{20}$ cm$^{-3}$ near the conductor 28 to assure a low resistance current path. The dopant concentration of the collector diminishes from the peak value as the layer is grown to a relatively low concentration, e.g., $10^{16}$ cm$^{-3}$ to $10^{17}$ cm$^{-3}$ and then changes to a relatively high p-type concentration, e.g., $10^{18}$ cm$^{-3}$, in order to form a transistor base 52 along the polysilicon layer 34. The base is initially formed with Si and then transitions to a SiGe alloy with a germanium molefraction typically in the range of 5 percent to 50 percent and exemplararily at about 30 percent. See also FIG. 4. The uppermost 30 nm of the plug 44 is essentially undoped in order to provide a buffer region for the yet-to-be-formed emitter.

Spacer elements 56 are formed over the base 52 by, for example, TEOS-deposited silicon oxide or deposited silicon nitride. With the spacer element shape defined by a conventional dry etch, the emitter and emitter contact are formed in layer 60. Approximately 3000 Å (300 nm) of in situ-doped n-type polysilicon is deposited to form layer 60 by, for example, furnace deposition, with phosphorous or arsenic added to reach a dopant concentration in the range of $10^{20}$ cm$^{-3}$ to $10^{21}$ cm$^{-3}$. Alternately the dopant concentration of layer 60 may be effected with an implant. The portion 64 of the polysilicon layer 60 provides the transistor emitter.

Figure 5:
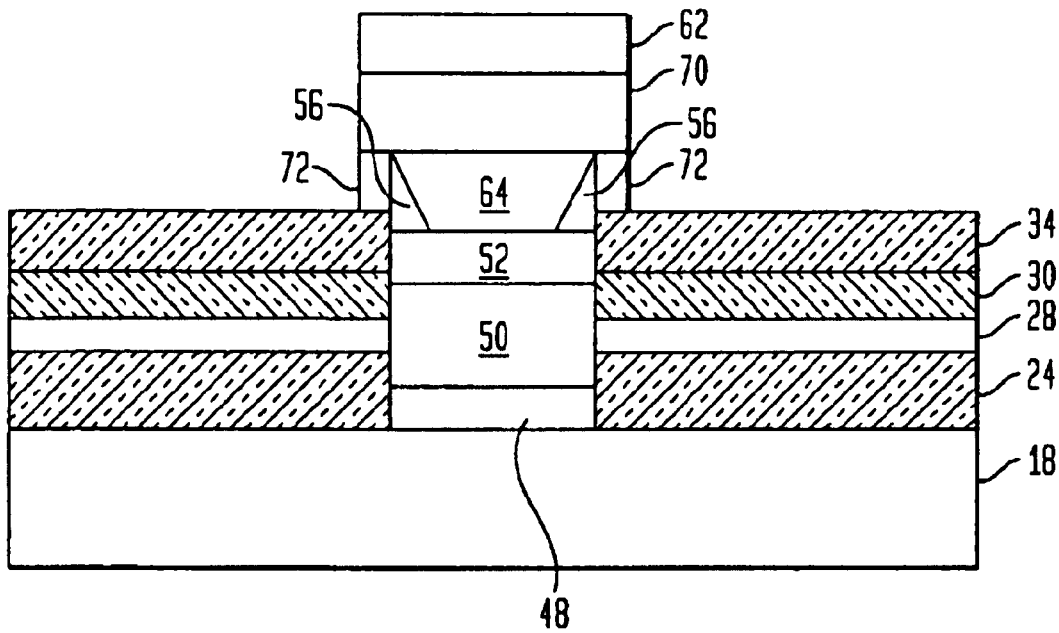

A TEOS-deposited silicon oxide layer 68 (see again FIG. 4 as well as FIG. 5), approximately 3000 Å (300 nm) thick, is formed over the layer 60, then patterned with photoresist and etched to create a hard mask 62 to define an emitter contact region 70 with a subsequent anisotropic dry etch. Note, the width (i.e., along the FIG. 5 cross sectional view) of the hard mask 62 is greater than that of the original opening 40 (FIG. 3) such that the anisotropic etch defines a width for the contact region 70 (again, taken along the FIG. 5 cross sectional view) greater than that of the opening 40. With a change in etch chemistry, portions of the silicon nitride layer 60 are also removed, leaving an insulative spacer element 72 formed in alignment with the contact region 70 according to definition of the hard mask 62.

Figure 6:
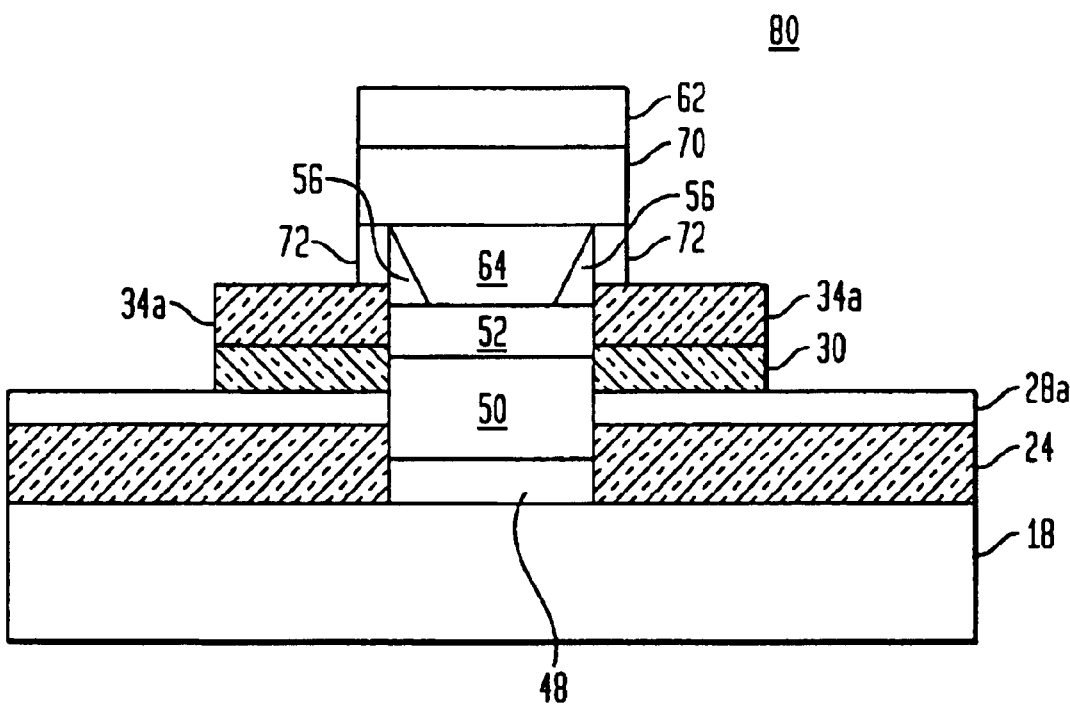

Next a layer of photoresist is deposited overall and patterned to etch away regions of the polysilicon layer 34 thereby defining an electrically isolated contact 34a. A corresponding portion of the silicon oxide layer 30 is etched away in alignment with the contact 34a. After a conventional photoresist strip and clean a second layer of photoresist is patterned so that segments of both the conductor layer 28 and the silicon oxide layer 24 are etched away thereby isolating a collector portion 28a of the conductor layer 28 from devices formed over other regions 16 and 18 (FIG. 1) of the substrate layer 10. The second layer of photoresist is stripped and the exposed surface is cleaned. The resulting vertical transistor structure 80, shown in FIG. 6, includes emitter 64, base 52 and collector 50, as well as three low-resistance conductor elements connected to each of the three transistor regions, i.e., collector conductor 28a contacting the collector 50, polysilicon layer 34a contacting the emitter 52 and contact region 70 integrally formed with the emitter 64. A rapid thermal anneal may next be performed to break down any interfacial oxide at the p-n junction between the base 52 and the emitter 64.

Figure 7:
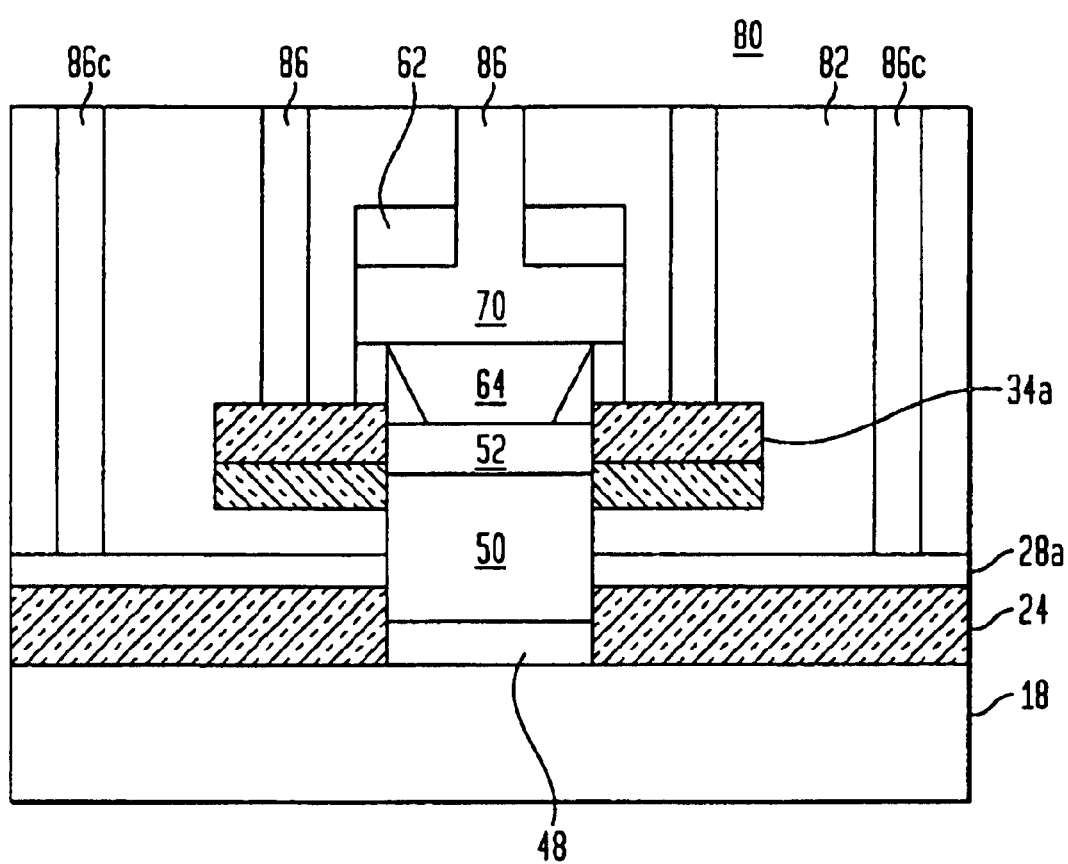

With reference to FIG. 7, an insulative layer 82 is deposited over exposed portions of the transistor structure 80 by, for example, first putting down a silicon oxide sublayer (200 nm+20 nm) by high density plasma deposition from silane, followed by a 750 nm sublayer of TEOS-deposited silicon oxide. The composite layer 82 is densified at 650 C. for 30–120 minutes. The resulting thickness of the layer is on the order of 950 nm. Contacts 86 are formed through the layer 82 to conductor 28a, polysilicon layer 34a and contact region 70. The contacts are formed by opening windows with standard photoresist patterning and vertical etching, followed by conventional metal deposition (e.g., depositing a Ti barrier (approximately 60 nm), then approximately 75 nm of TiN, annealing the Ti/TiN stack and depositing W to fill the openings. The structure is then polished to remove metal from the surface of the insulative layer 82 and provide sufficient planarity prior to formation of the first level of interconnect metallization. The overlying interconnect system 90 (not fully illustrated) may be Al or Cu based, formed with subtractive etch techniques or a Damascene technology. Although contacts 86 are shown as connecting with conductor 28a, collector 50 and polysilicon layer 34a in the same cross sectional plane, this is for purposes of schematic illustration only. In actual practice contacts to individual regions of the transistor may extend to different levels of interconnect and are not likely be in the same plane.

A feature of the structure 80 is that the collector conductor 28a provides connection between the via contact (designated 86c) and the collector in a plane (designated by the arrows 90) which traverses the entire path of the conductor 28a as well as the collector 50. Thus there is no need to conduct current below the collector, e.g., into the subcollector 48, in order to provide electrical connection between the collector and its associated contact to the interconnect metallization. With this feature the subcollector 48 can be functionally isolated from the collector 50, e.g., by forming it of opposite conductivity type from the collector 50, in which case the subcollector would be an epitaxial extension of the upper portion 14. See also FIG. 1.

There has been illustrated a device architecture which exhibits substantially reduced resistance and a low device-to-substrate capacitance useful in bipolar, BiCMOS and other applications. While specific applications of my invention have been illustrated the principles disclosed herein provide a basis for practicing the invention in a variety of ways on a variety of semiconductor structures. Other constructions, although not expressly described herein, do not depart from the scope of the invention which is only limited by the claims which follow.

I claim:
1. An integrated electronic device comprising:
a substrate layer of semiconductor material having a major surface formed along a crystal plane with a first region of a first conductivity type formed therein;
a semiconductor layer epitaxially grown on the first surface region, said layer including a first portion of a second conductivity type formed along the plane and a second portion of the first conductivity type formed over the first portion, said first portion and said first surface region forming a pn junction.

2. The device of claim 1 further comprising:
a dielectric layer over the semiconductor layer with a contact via formed therein to provide an electrical path from the plane along which the first portion is formed to a region above the plane;
a conductive layer providing an electrical path in said plane from the first portion to the contact via.

3. The device of claim 1 wherein the first portion includes a first subregion formed over a second subregion, the first subregion having a net dopant concentration of the first conductivity type in a first range, the second subregion having net dopant concentration of the second conductivity type in a second range, said second range having a peak value less than the peak value in the first range and a minimum value less than the minimum value in the first range.

4. The device of claim 1 wherein a bipolar transistor is formed over the substrate layer with the first portion of the semiconductor layer forming a collector and the second portion of the semiconductor layer forming a base.

5. An integrated electronic device comprising:
a substrate layer of semiconductor material having a major surface formed along a crystal plane;
a deposited semiconductor layer formed over the major surface, including a first portion comprising a bipolar transistor collector of a first conductivity type and a bipolar transistor base of a second conductivity type formed over the collector and a second portion extending from the major surface to the collector;
an emitter formed over the base; and
a conductive layer providing electrical connection to the collector and positioned to extend between the major surface and the emitter.

6. The device of claim 5 wherein the deposited semiconductor layer is an epitaxially grown layer.

7. The device of claim 5 wherein the conductive layer has a sheet resistance less than 25 ohms per square.

8. An integrated electronic device comprising:
a substrate layer of semiconductor material having a major surface formed along a crystal plane;
a deposited semiconductor layer formed over the major surface, including a first substantially monocrystalline portion comprising a bipolar transistor collector of a first conductivity type and a bipolar transistor base of a second conductivity type formed over the collector and a second portion extending from the major surface to the collector;
an emitter formed over the base; and
a conductive layer providing electrical connection to the collector and electrically isolated from the substrate layer.

9. An integrated electronic device comprising:
a substrate layer of semiconductor material having a major surface formed along a crystal plane with first and second spaced-apart regions of opposite conductivity type formed therein;

a semiconductor layer deposited on the first region, said layer including a first portion comprising a bipolar transistor collector region and a bipolar transistor base region formed over the collector region, said collector region and said one surface region electrically isolated from one another by a pn junction.

10. The device of claim 9 further including an emitter formed over the base region and a conductive layer providing electrical connection to the collector in isolation from the substrate layer.

11. The device of claim 9 wherein the collector region includes a collector formed over a subcollector, the collector being of a first conductivity type with a net dopant concentration in a first range, the subcollector being of a second conductivity type with a net dopant concentration in a second range, said second range having a peak value less than the peak value in the first range and a minimum value less than the minimum value in the first range.

12. The device of claim 9 wherein the electrically isolated regions are positioned in an epitaxially grown layer.

13. The device of claim 9 wherein a transistor is formed on the second region.

14. The device of claim 9 wherein a bipolar transistor is formed on the second region.

15. The device of claim 9 wherein the substrate layer includes a plurality of additional spaced-apart regions of alternating conductivity type each such region having a semiconductor layer epitaxially grown thereover, each epitaxial region including a first portion comprising a bipolar transistor collector region and a bipolar transistor base region formed over the collector, with the collector and underlying surface region electrically isolated from one another by a pn junction.

16. An integrated electronic device comprising:

a substrate layer of semiconductor material having a major surface formed along a crystal plane;

a substantially monocrystalline semiconductor layer formed on the substrate layer, including a first portion of a first conductivity type and a second portion of a second conductivity type formed over the first portion, the first portion formed along a plane parallel to the major surface;

a dielectric layer over the semiconductor layer with a contact via formed therein to provide an electrical path from the plane along which the first portion is formed to a region above the plane; and a conductive layer providing an electrical path in said plane from the first portion to the contact via.

17. An integrated electronic device comprising:

a substrate layer of semiconductor material having a major surface formed along a crystal plane;

a semiconductor layer deposited over the major surface, including a first portion, comprising a bipolar transistor collector of a first conductivity type and a bipolar transistor base of a second conductivity type formed over the collector and a second portion extending from the major surface to the collector, the collector formed along a plane parallel to the major surface;

a dielectric layer over the semiconductor layer with a contact via formed therein to provide an electrical path from the plane along which the collector is formed to a region above the plane;

an emitter formed over the base; and a conductive layer providing an electrical path in said plane from the collector to the contact via.

\* \* \* \* \*